(12) United States Patent
Song et al.

(10) Patent No.: US 7,229,860 B2
(45) Date of Patent: Jun. 12, 2007

(54) METHOD FOR MANUFACTURING A THIN FILM TRANSISTOR USING POLY SILICON

(75) Inventors: Jean-Ho Song, Pyeongtaek (KR); Joon-Hoo Choi, Seoul (KR); Beom-Rak Choi, Seoul (KR); Myung-Koo Kang, Seoul (KR); Sook-Young Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 10/499,090

(22) PCT Filed: Jan. 29, 2002

(86) PCT No.: PCT/KR02/00131

§ 371 (c)(1),
(2), (4) Date: Feb. 7, 2005

(87) PCT Pub. No.: WO03/052833

PCT Pub. Date: Jun. 26, 2003

(65) Prior Publication Data

US 2005/0130357 A1    Jun. 16, 2005

(30) Foreign Application Priority Data

Dec. 17, 2001   (KR) ............................... 2001-80074

(51) Int. Cl.
*H01L 21/00* (2006.01)
(52) U.S. Cl. ...................... 438/150; 438/197; 438/198
(58) Field of Classification Search ................ 438/149, 438/150, 198, 487, 197
See application file for complete search history.

(56) References Cited

U.S. PATENT DOCUMENTS 4,214,946 A    7/1980  Forget et al.

(Continued)

FOREIGN PATENT DOCUMENTS

JP          05-226654        9/1993

(Continued)

OTHER PUBLICATIONS

English Abstract for JP 09-213630.

(Continued)

*Primary Examiner*—Thao P. Le
(74) *Attorney, Agent, or Firm*—Cantor Colburn LLP (57) ABSTRACT

A manufacturing method of a thin film transistor. An amorphous silicon thin film is formed on an insulating substrate, and is crystallized by a lateral solidification process with illumination of laser beams into the amorphous silicon thin film to form a polysilicon thin film. Next, protrusion portions protruding from the surface of the polysilicon thin film are removed by plasma dry-etching using a gas mixture including $Cl_2$, $SF_6$ and Ar at the ratio of 3:1:2 to smooth the surface of the polysilicon thin film, and the semiconductor layer is formed by patterning the polysilicon thin film. A gate insulating film covering the semiconductor layer is formed and a gate electrode is formed on the gate insulating film opposite the semiconductor layer. A source region and a drain region opposite each other with respect to the gate electrode are formed by implanting impurities into the semiconductor layer and a source electrode and drain electrode are formed to be electrically connected to the source region and drain region.

12 Claims, 7 Drawing Sheets

U.S. PATENT DOCUMENTS

| | | | |
|---|---|---|---|
| 5,160,408 A | | 11/1992 | Long |
| 6,074,954 A | | 6/2000 | Lill et al. |
| 6,207,483 B1 | * | 3/2001 | Fu et al. ..................... 438/199 |
| 6,812,071 B2 | * | 11/2004 | Hayashi et al. ............. 438/149 |
| 6,861,614 B1 | * | 3/2005 | Tanabe et al. ......... 219/121.66 |
| 7,056,629 B2 | * | 6/2006 | Crowder ........................ 430/5 |
| 2002/0072158 A1 | * | 6/2002 | Tanabe et al. ............... 438/164 |
| 2002/0083557 A1 | * | 7/2002 | Jung ....................... 23/295 R |
| 2002/0094639 A1 | * | 7/2002 | Reddy ........................ 438/257 |
| 2003/0013239 A1 | * | 1/2003 | Tanabe et al. ............... 438/151 |
| 2005/0037550 A1 | * | 2/2005 | Kang et al. .................. 438/166 |
| 2005/0083445 A1 | * | 4/2005 | Kang et al. .................... 349/42 |
| 2005/0112809 A1 | * | 5/2005 | Ryu et al. .................... 438/166 |
| 2005/0239240 A1 | * | 10/2005 | Ohtani et al. ............... 438/166 |

FOREIGN PATENT DOCUMENTS

| | | |
|---|---|---|
| JP | 08-042147 | 8/1997 |
| JP | 2000-133634 | 5/2000 |
| JP | 2000-353811 | 12/2000 |
| JP | 2001-142094 | 5/2001 |
| JP | 2001-250776 | 9/2001 |
| JP | 2001-274088 | 10/2001 |
| KR | 2000-40705 | 7/2000 |

OTHER PUBLICATIONS

English Abstract for JP 2000-353811.
English Abstract for JP 2001-250776.
English Abstract for JP 05-226654.
English Abstract for JP 2001-274088.
English Abstract for JP 2000-133634.
English Abstract for JP 2001-142094.

* cited by examiner

METHOD FOR MANUFACTURING A THIN FILM TRANSISTOR USING POLY SILICON

CROSS-REFERENCE TO RELATED APPLICATION

This application is a 371 of PCT/KR02/00131 filed Jan. 29, 2002 which claims the benefit of Korea Patent Application No. 2001/80074, filed Dec. 17, 2001, the contents of which are hereby incorporated herein by reference in their entirety.

BACKGROUND OF THE INVENTION (a) Field of the Invention

The present invention relates to a manufacturing method of a polysilicon thin film transistor.

(b) Description of the Related Art

Generally, a liquid crystal display ("LCD") has two panels with electrodes, and a liquid crystal layer interposed between the two panels. The two panels are sealed to each other by way of a sealant printed around edges of the panels while being spaced apart from each other by way of spacers.

The LCD generates electric field in the liquid crystal layer interposed between the panels and having dielectric anisotropy by using the electrodes and adjusts the strength of the electric field to control the light transmittance, thereby displaying images. Thin film transistors ("TFTs") are used for controlling signals transmitted to the electrodes.

A most usual TFT for utilizes amorphous silicon as a semiconductor layer.

The amorphous silicon TFT bears a mobility of about 0.5–1 $cm^2$/Vsec. Such a TFT may be used as a switching element of the LCD. However, since the TFT has lower mobility, it is inadequate for directly forming a driving circuit on the liquid crystal panel.

In order to overcome such a problem, it has been proposed that the polysilicon bearing a current mobility of about 20–150 $cm^2$/Vsec should be used as the semiconductor layer of a TFT for an LCD. As the polysilicon TFT involves relatively high current mobility, a Chip In Glass technique which incorporates driving circuits into a liquid crystal panel can be realized.

In order to form the polysilicon thin film, it has been proposed to employ a technique of directly depositing polysilicon on a substrate at high temperature, a technique of depositing amorphous silicon on a substrate and crystallizing the polysilicon layer at high temperature of about 600° C., and a technique of depositing amorphous silicon on a substrate and heat-treating the amorphous silicon layer using laser. However, such techniques require high temperature processing and hence, it becomes difficult to employ the techniques to a glass substrate for a liquid crystal panel. Furthermore, the uniformity in the electrical characteristics between the TFTs is deteriorated due to the non-uniform grain boundaries.

In order to solve such a problem, a sequential lateral solidification process which can control the distribution of the grain boundaries in an artificial manner has been developed. This is a technique based on the fact that the grains of the polysilicon grow perpendicular to the interface between the laser-illuminated liquid phase region and the non-illuminated solid phase region. The laser beam passes through a mask with slits to completely melt local portions of the amorphous silicon to form liquid phase regions in slit shapes at the amorphous silicon layer. Thereafter, the liquid phase amorphous silicon is cooled to be crystallized. The growth of crystal begins from the boundary of the solid phase region where the laser is not illuminated, and proceeds perpendicular thereto. The grains stop growing at the center of the liquid phase region while meeting there. Such a process is repeated while moving the mask slits in the growing direction of the grains so that the sequential lateral solidification can be made throughout the entire target area.

However, a protrusion portion is formed on the grain boundary surface of the polysilicon layer crystallized by the sequential lateral solidification process. Accordingly a photoresist film is not completely applied on an upper surface of the polysilicon layer. To solve the problem, an organic cleaning process, or a cleaning process using HF is practiced, but it is not effective because the protrusion portion is not completely removed.

SUMMARY OF THE INVENTION

It is an object of the present invention to provide a method of manufacturing a polysilicon TFT for efficiently remove protrusion portions formed during a poly-crystallization process.

In order to accomplish the object, after amorphous silicon is crystallized into polysilicon, the surface of the polysilicon is smoothed by plasma dry etch.

In detail, an amorphous silicon thin film is deposited on an insulating substrate, and illuminated by laser beam to be crystallized using a lateral solidification process to form a polysilicon thin film. The surface of the polysilicon thin film is smoothed by plasma dry-etching process, and the polysilicon thin film is patterned to form a semiconductor layer. A gate insulating film covering the semiconductor layer is formed, and a gate electrode is formed on the gate insulating film opposite the semiconductor layer. A source region and a drain region opposite each other with respect to the gate electrode are formed by implanting impurity into the semiconductor layer. A source electrode and a drain electrode electrically connected to the source region and the drain region, respectively, are formed.

Preferably, a passivation film including $SiN_x$, SiOC, SiOF, or an organic insulating material is formed between the drain electrode and the pixel electrode.

It is preferable that the plasma dry-etching uses $O_2$, $H_2$ or He, and the plasma dry-etching uses a gas mixture including $Cl_2$, $SF_6$ and Ar at the ratio of 2.5–3.5:0.5–1.5:1.5–2.5. The plasma dry-etching is preferably performed at pressure equal to or less than 5 mT.

According to an embodiment of the present invention, the lateral solidification process uses a mask having a plurality of slit patterns defining transmission regions of the laser beams, and the slit patterns are aligned in a first direction and a second direction perpendicular to the first direction on at least two areas such that grains of the polysilicon layer grow in at least two directions. The positions of the slit patterns aligned in the first direction in the at least two areas are differentiated, and positions of the slit patterns aligned in the second direction in the at least two areas are differentiated.

According to an embodiment of the present invention, the lateral solidification process uses a mask having a plurality of slit patterns defining transmission regions of the laser beams, and the widths of the slit patterns sequentially decrease or increase along a direction. The mask preferably includes at least two areas having the slit patterns, and the slit patterns in each area have the same width. It is preferable that the center lines of the plurality of slit patterns in the areas along the direction coincide.

BRIEF DESCRIPTION OF THE DRAWINGS

FIGS. 2a to 2f are sectional views of a polysilicon TFT sequentially illustrating a method of manufacturing a polysilicon TFT according to an embodiment of the present invention;

DETAILED DESCRIPTION OF PREFERRED EMBODIMENTS

A manufacturing method of a polysilicon TFT according to embodiments of the present invention will be described with reference to the accompanying drawings such that ordinary skill in the art can carry out.

A crystallization method according to an embodiment of the present invention is performed by completely melting amorphous silicon by partially illuminating excimer laser beam thereto to form liquid phase regions and cooling down the liquid phase regions to be crystallized. At that time, a plasma process is made to remove protrusion portions formed at the interfaces between grain boundaries or places where the grains grow to encounter each other. The method will be described in detail with reference to the figures.

First, a structure of the polysilicon TFT according to an embodiment of the present invention will be described with reference to FIG. 1.

Figure 1:
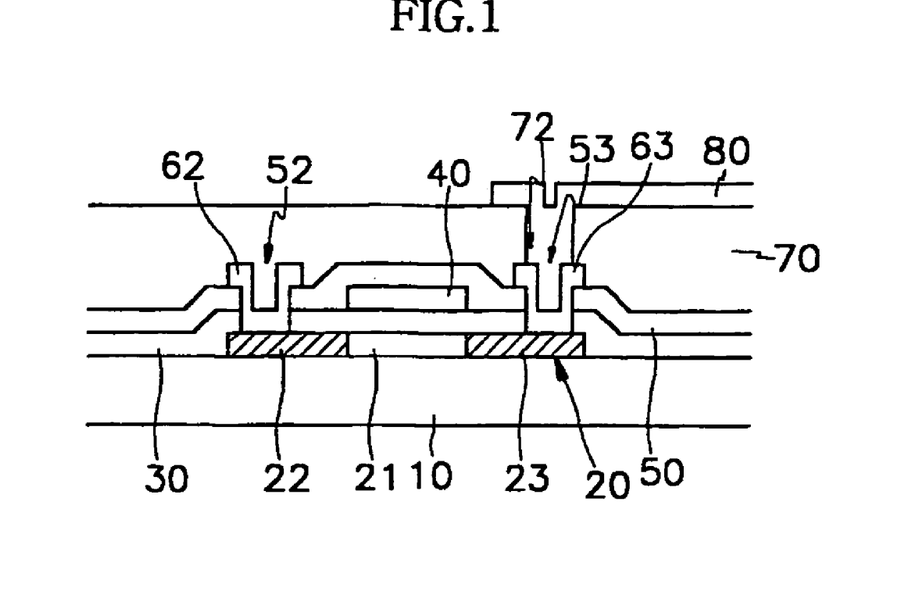
FIG. 1 is a sectional view of a polysilicon TFT according to an embodiment of the present invention.

FIG. 1 is a sectional view of a polysilicon TFT according to an embodiment of the present invention.

As shown in FIG. 1, a semiconductor layer 20 of polysilicon is formed on an insulating substrate 10. The semiconductor layer 20 includes a channel region 21 and a source region 22 and a drain region 23 opposite each other with respect to a channel region 21. The source and drain regions 22 and 23 are doped with n type or p type impurities and may include a silicide layer.

A gate insulating film 30 of $SiO_2$ or $SiN_x$ is formed on the substrate 10 to cover the semiconductor layer 20. A gate electrode 40 is formed on the gate insulating film 30 opposite the channel region 21. A gate line (not shown) connected to the gate electrode 40 may be further provided on the gate insulating film 30.

An interlayer insulating film 50 is formed on the gate insulating film 30 to cover the gate electrode 40, the gate insulating film 30 and interlayer insulating film 50 have contact holes 52 and 53 respectively exposing the source and drain regions 22 and 23 of the semiconductor layer 20.

A source electrode 62 and a drain electrode 63 are formed on an upper surface of the interlayer insulating film 50. The source electrode 62 is connected to the source region 22 through the contact hole 52 and the drain electrode 63 is located opposite the source electrode 62 with respect to the gate electrode 40 and connected to the drain region 23 through the contact hole 53. At that time, a data line (not shown) connected to the source electrode 40 may be further formed on the interlayer insulating film 50.

A passivation film 70 made of $SiN_x$, $SiO_2$, SiOC, SiOF, or organic insulating material is formed on the interlayer insulating film 50 and a pixel electrode 80 is formed on the passivation film 70. The pixel electrode 80 is connected to the drain electrode 63 through the contact hole 72 of the passivation film 70.

A buffer layer may be provided between the substrate 10 and the semiconductor layer 20 in this TFT.

Next, referring to FIG. 1 and FIGS. 2A to 2F, a manufacturing method of polysilicon TFT according to an embodiment of the present invention will be described in detail.

FIGS. 2A to 2F are sectional views of a polysilicon TFT sequentially illustrating a manufacturing method thereof according to an embodiment of the present invention.

Figure 2A:
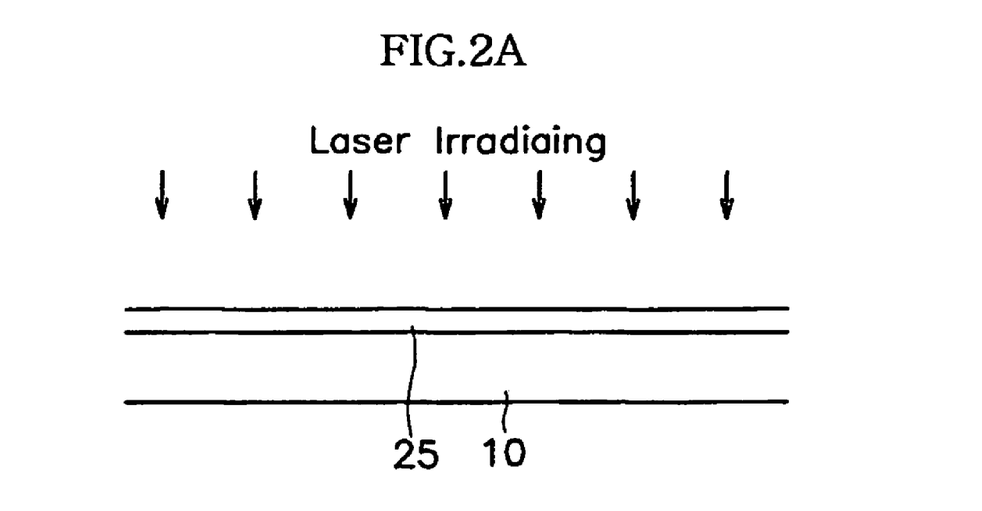

As shown in FIG. 2A, a polysilicon thin film 25 is formed on the substrate 10 by a lateral solidification process. That is, after an amorphous silicon thin film is deposited on the substrate 10 by low pressure chemical vapor deposition ("CVD"), plasma enhanced CVD or sputtering, excimer laser beams are illuminated into the amorphous silicon thin film to melt the amorphous silicon to be liquefied, and the liquefied amorphous silicon is cooled down to grow grains. It is preferable that the grains of the polysilicon have a desired size in order to maximize a current mobility of the TFT. For this purpose, it is preferable that each slit in each area through which the excimer laser beams passes during the lateral solidification process has the uniform width, while the slit width gradually increases or decreases as it goes along a specific direction. Furthermore, for obtaining the current mobility isotropic to several directions when forming the TFT, it is preferable that the slits in each area are aligned in one direction, while those in different areas are aligned in the different directions. It will be described in detail later.

Figure 2B:
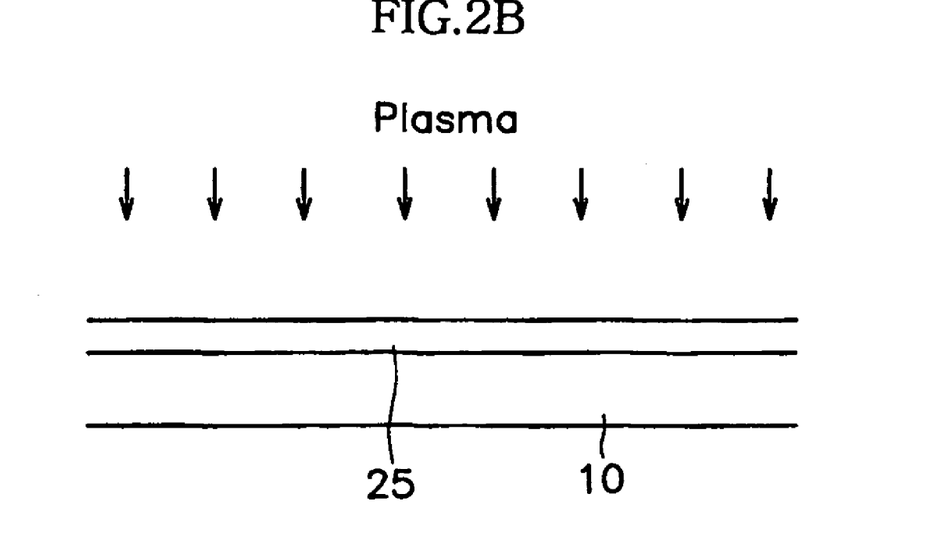

As shown in FIG. 2B, protrusion portions protruding from the surface of the polysilicon thin film 25 are removed by dry-etching such as a plasma process using $O_2$, He, $H_2$ or a gas mixture of $Cl_2$, $SF_6$ and Ar with a ratio in a range of 2.5–3.5:0.5–1.5:1.5–2.5, thereby smoothing the surface of the polysilicon thin film 25. It will be described in detail with reference to experimental results. The planarization of the surface of the polysilicon thin film 25 using plasma dry-etching enables to coat a photoresist film overall in the subsequent photo etching process.

Figure 2C:
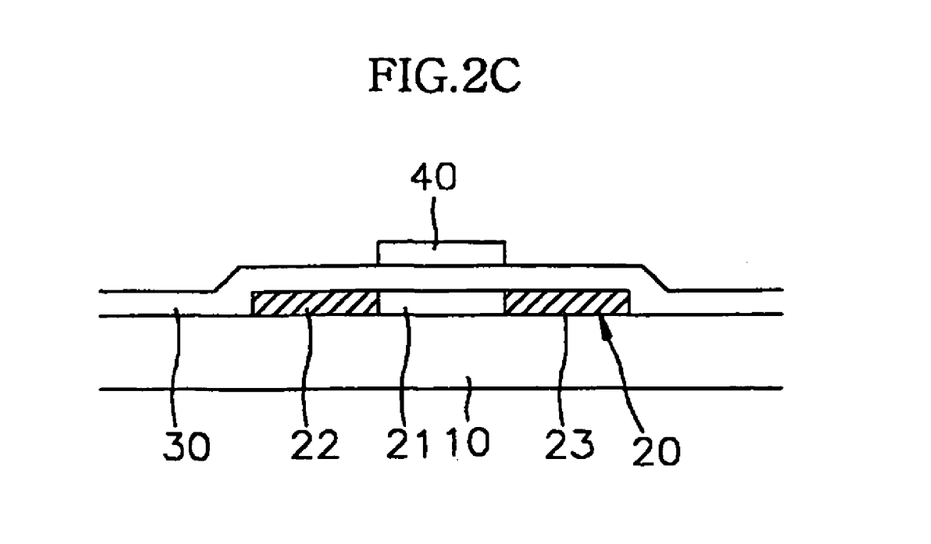

As shown in FIG. 2C, a photoresist film is coated on the polysilicon thin film 25 and photo-etched by using an active area mask to form a photoresist film pattern. Thereafter, the polysilicon thin film 25 is patterned by using the photoresist film pattern to form the semiconductor layer 20. $SiO_2$ or $SiN_x$ is deposited to form a gate insulating film 30, a conductive material for a gate wire is deposited and patterned by photo etch using a mask to form a the gate electrode 40 on the channel region 21 of the semiconductor layer 20. A source region and a drain region 22 and 23 opposite each other with respect to the channel region 21 are formed by ion-implantation and activation of p type or n type impurities into the semiconductor layer 20.

Figure 2D:
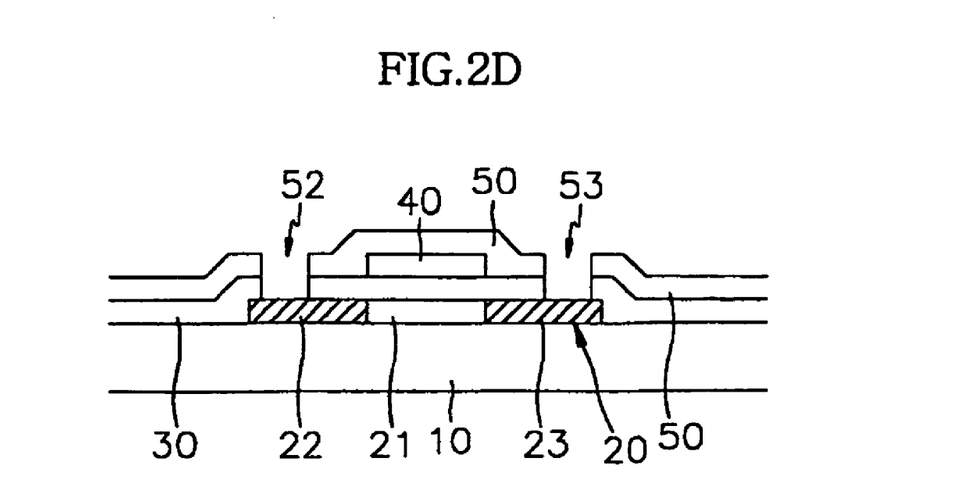

As shown in FIG. 2D, an interlayer insulating film 50 covering the gate electrode 49 is formed on the gate insulating film 30. Thereafter, the contact holes 52 and 53 exposing the source and the drain regions 22 and 23 of the semiconductor layer 20 are formed by patterning the interlayer insulating film 50 together with the gate insulating film 30.

Figure 2E:
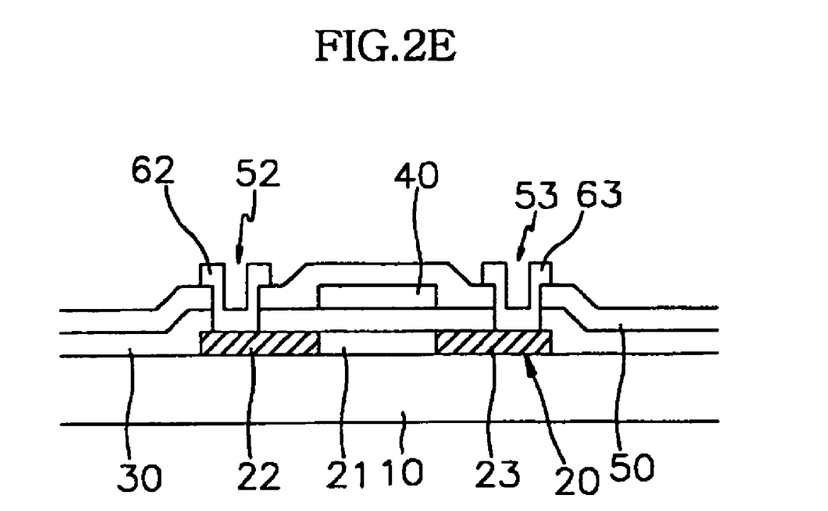

Referring to FIG. 2E, a metal for a data wire is deposited on the insulating substrate 10 and is patterned to form source and drain electrodes 62 and 63 connected to the source region 22 and the drain region 23 through the contact holes 52 and 53, respectively.

Figure 2F:
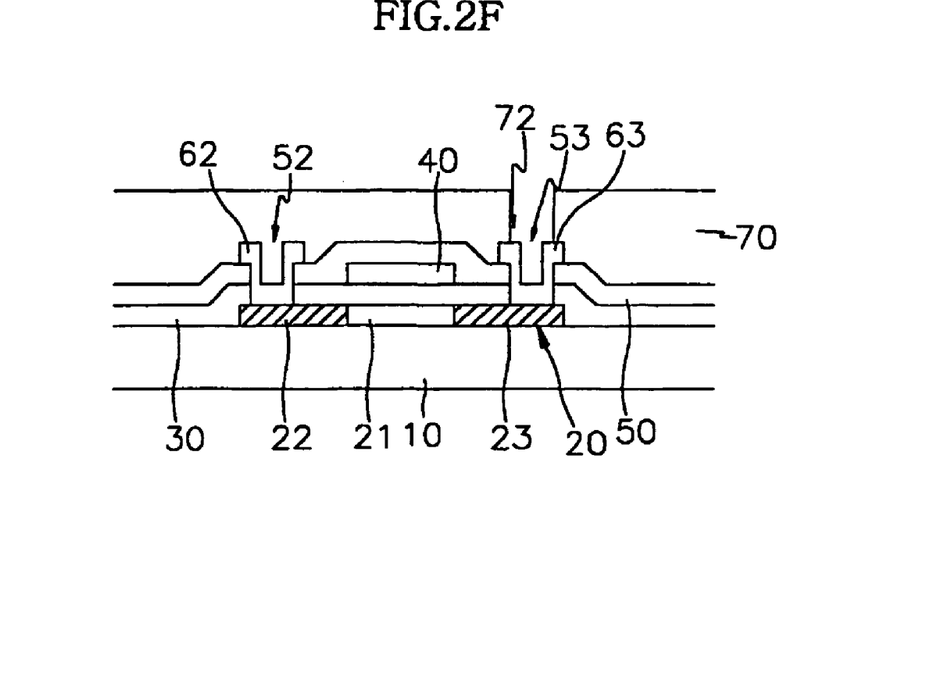

As shown in FIG. 2F, an insulating material is deposited on the insulating substrate 10 to form a passivation film 70, which is patterned to form a contact hole 72 exposing the drain electrode 63.

With reference to FIG. 1, a transparent conductive material such as ITO (indium thin oxide) or IZO (indium zinc oxide) or a reflective conductive material is deposited on the passivation film 70 and patterned to form a pixel electrode 80.

The result of the above-described plasma dry etch of a polysilicon thin film is described with reference to an experiment.

EXPERIMENTAL EXAMPLE

In the experimental example of the present invention, the plasma dry etch is performed by using a gas mixture of $Cl_2$, $SF_6$ and Ar at the ratio of 3:1:2.

Figure 3A:
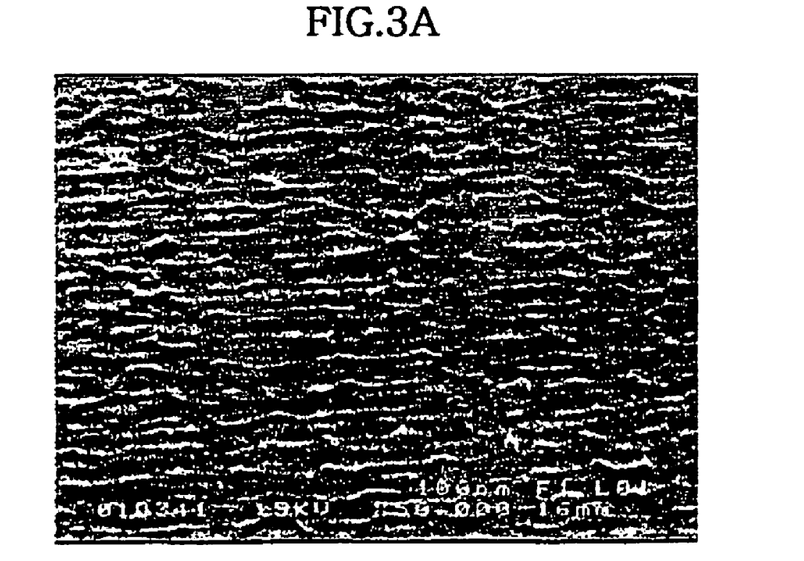
FIG. 3a is a photograph of a surface of a polysilicon thin film formed by a lateral solidification crystallization process.
Figure 3B:
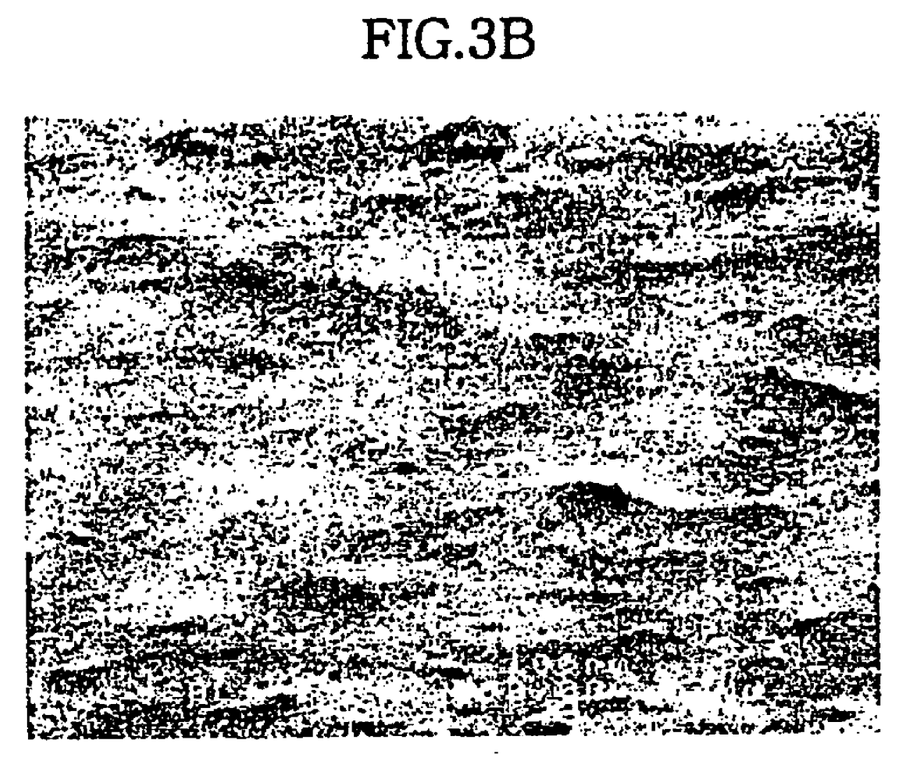
FIG. 3b is a photograph of a surface of a polysilicon thin film after plasma dry-etched according to an experimental example of the present invention.

FIG. 3A is a photograph of a surface of the polysilicon thin film formed by a lateral solidification crystallization process and FIG. 3B is a photograph of a surface of the polysilicon thin film after plasma dry-etched according to an experimental example of the present invention.

As shown in FIG. 3A, the surface of the polysilicon thin film formed by the lateral solidification process was uneven. However, as shown in FIG. 3B, the surface of the polysilicon thin film after the plasma dry etch was uniform because the protrusion portions are removed by plasma dry-etching process.

Now, structures of masks used in the lateral solidification process according to an embodiment of the present invention will be described in detail.

Figure 4:
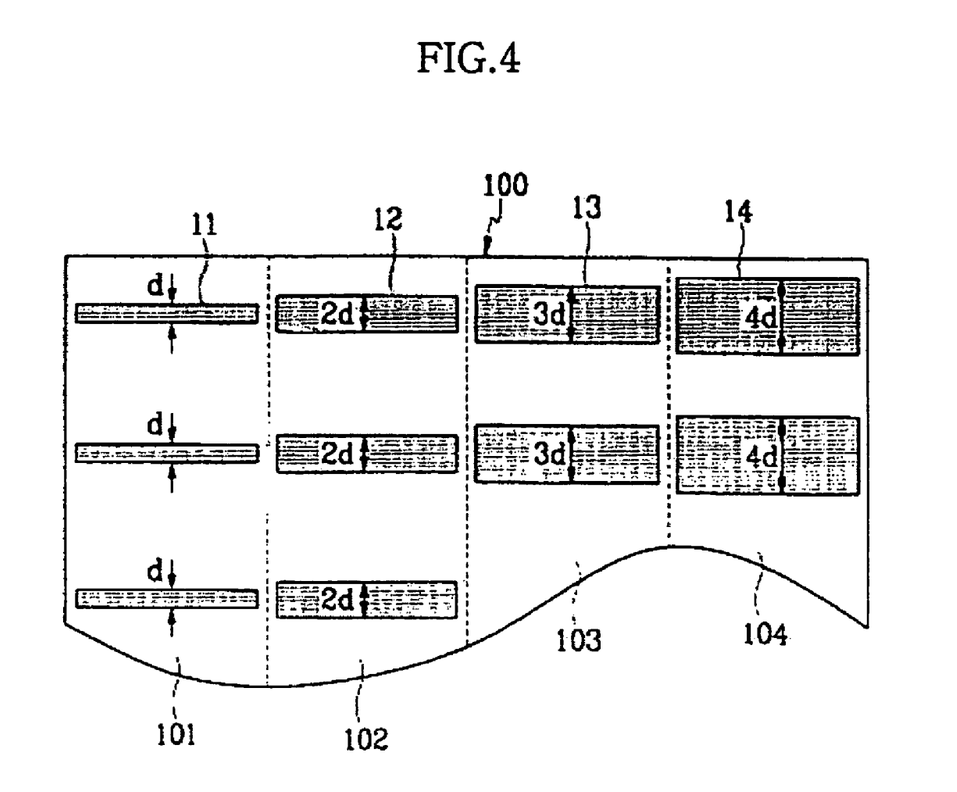
FIGS. 4 and 5 show structures of masks used in a manufacturing method of a polysilicon TFT according to embodiments of the present invention.
Figure 5:
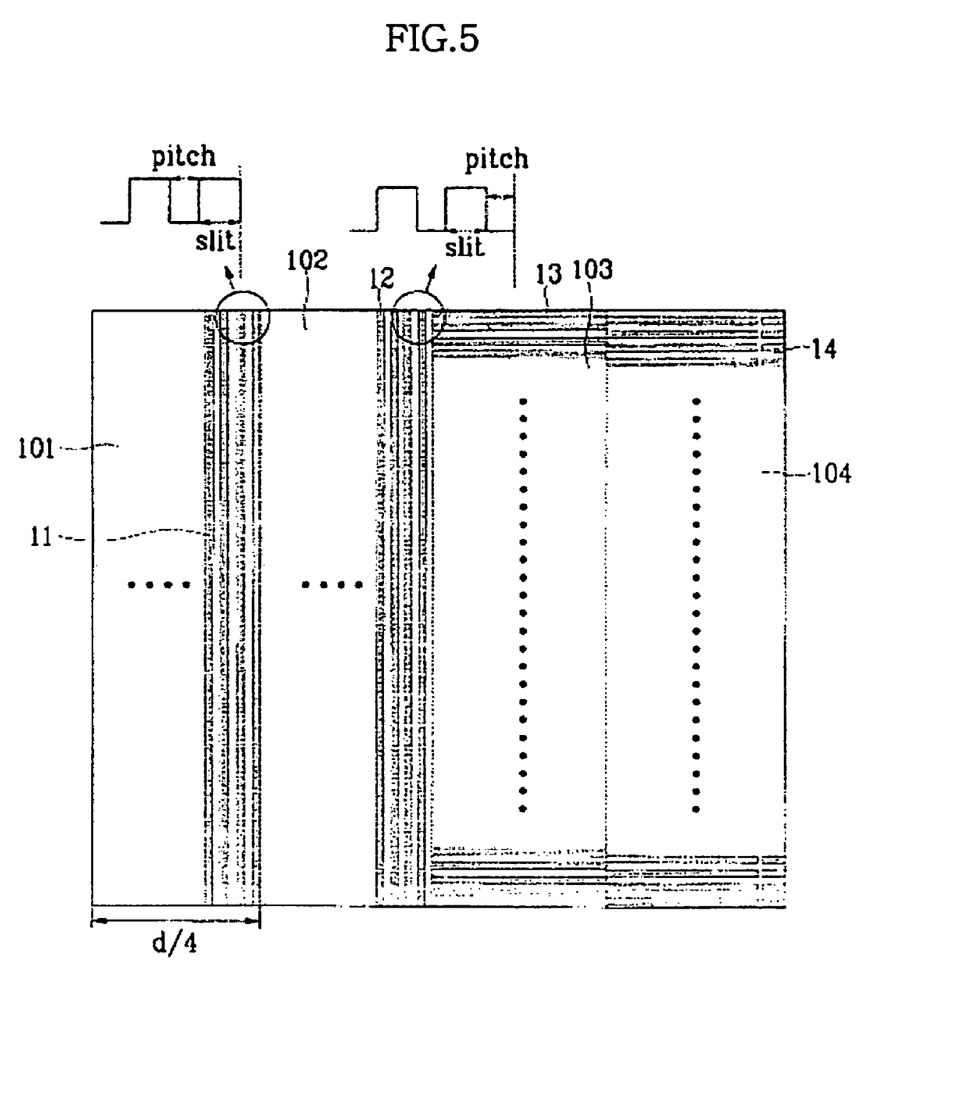

FIGS. 4 and 5 show masks used in a manufacturing process of a TFT according to embodiments of the present invention.

As shown in FIG. 4, a mask for polysilicon used in a method of manufacturing method of a thin film transistor according to an embodiment of the present invention includes a plurality of slit areas 101–104. In each slit area 101–104, a plurality of slit patterns 11–14 extending in a transverse direction are arranged in a longitudinal direction and has the same width. The widths of the slit patterns 11–14 on the slit areas 101–104 become gradually larger by multiple of the width d of the slit pattern 11 on the slit area 101 as progress in the transverse direction. Here, the center lines of the slit patterns 11–14 arranged in the transverse direction coincide, the distance between the center lines of the adjacent slit patterns 11–14 on each slit area 101–104 is eight times of the width d. In this embodiment, the slit areas 101–104 are arranged in order that the widths of the slit patterns 11–14 become larger, but they may be arranged on the contrary. Furthermore, although the slit areas 101–104 are arranged in the transverse direction in this embodiment, but it may be arranged in the longitudinal direction. Furthermore, the number of the slit areas may be increased or decreased, and the maximum width of the slit patterns may be less or more than 4 d. The intervals between the adjacent slit patterns 11–14 on the respective slit areas 101–104 may vary in accordance with the variations of the arrangements.

As shown in FIG. 5, a mask for polysilicon used in a manufacturing method of a TFT according to another embodiment of the present invention has first to fourth slit areas 101–104, i.e., longitudinal slit areas 101 and 102 and transverse slit areas 103 and 104. A plurality of slit patterns 11 and 12 extending in a longitudinal direction are arranged on the longitudinal slit areas 101 and 102, while a plurality of slit patterns 13 and 14 extending in a transverse direction are arranged on the transverse slit areas 103 and 104. The positions of the slit patterns 11 and 12 on the first and the second slit areas 101 and 102 are differentiated by a pitch, a distance between the slit patterns 11 and 12, and the positions of the slit patterns 13 and 14 on the third and the fourth slit areas 103 and 104 are differentiated by the pitch, the distance between the slit patterns 13 and 14.

When the sequential lateral solidification process is made by irradiating the laser beams while sequentially moving the mask by d/4 according the embodiment of the present invention, the differentiated arrangements of the slit patterns 11 and 12 on the longitudinal slit areas 101 and 102 make grains grow twice in the transverse direction. Furthermore, the differentiated arrangements of the slit patterns 13 and 14 on the longitudinal slit areas 103 and 104 make the grains grow twice in the longitudinal direction. As a result, the grains can have an isotropic size with respect to the transverse direction and the longitudinal direction.

Accordingly, the amorphous silicon is crystallized into polysilicon using such a mask to grow the grains in various directions. Since the TFT including a semiconductor layer of polysilicon made by the method can have the isotropic current mobility in the longitudinal and transverse directions, a plurality of TFTs aligned in various directions on an LCD panel can have uniform characteristics.

According to the present invention, an amorphous silicon layer is crystallized into a polysilicon layer and the polysilicon is smoothed by plasma dry-etching to improve the evenness of the polysilicon layer, thereby evenly enabling the photoresist film to be evenly coated. As a result, the characteristics of the TFTs and an LCD including the TFTs can be improved.

What is claimed is:

1. A method of manufacturing a thin film transistor, comprising:
    crystallizing an amorphous silicon thin film by illuminating laser beam onto the amorphous silicon thin film using a lateral solidification process to form a polysilicon thin film, wherein the lateral solidificating process uses a mask having a plurality of slit patterns defining transmission regions of the laser beams, and the slit patterns are aligned in a first direction and a second direction perpendicular to the first direction on at least two areas such that grains of the polysilicon layed grow in at least two directions;
    smoothing a surface of the polysilicon thin film by plasma dry-etching process;
    forming a semiconductor layer by patterning the polysilicon thin film;
    forming a gate insulating film covering the semiconductor layer;
    forming a gate electrode on the gate insulating film opposite the semiconductor layer;
    forming a source region and a drain region opposite each other with respect to the gate electrode by implanting impurity into the semiconductor layer; and
    forming a source electrode and a drain electrode electrically connected to the source region and the drain region, respectively.

2. The method of claim 1, further comprising:
    forming pixel electrode connected to the drain electrode; and forming a passivation film including SiNx, SiOC, SiOF, or an organic insulating material between the drain electrode and the pixel electrode.

3. The method of claim 1, wherein the plasma dry-etching uses O2, H2 or He.

4. The method of claim 1, wherein the plasma dry-etching uses a gas mixture including Cl2, SF6 and Ar at the ratio of 2.5–3.5:0.5–1.5:1.5–2.5.

5. The method of claim 1, wherein the plasma dry-etching is performed at pressure equal to or less than 5 mT.

6. The method of claim 1, wherein positions of the slit patterns aligned in the first direction in the at least two areas are differentiated, and positions of the slit patterns aligned in the second direction in the at least two areas are differentiated.

7. The method of claim 6, wherein the numbers of the areas where the slit patterns aligned in the first direction are two, and the numbers of the areas where the slit patterns aligned in the second direction are two.

8. The method of claim 7, wherein the positions of the slit patterns aligned in the first direction are differentiated by a distance between the slit patterns, and the positions of the slit patterns aligned in the second direction are differentiated by a distance between the slit patterns.

9. A method of manufacturing a thin film transistor, comprising:
  crystallizing an amorphous silicon thin film by illuminating laser beam onto the amorphous silicon thin film using a lateral solidification process to form a polysilicon thin film, wherein the lateral solidification process uses a mask having a plurality of slit patterns defining transmission regions of the laser beams, and the widths of the slit patterns sequentially decrease or increase along a direction;
  smoothing a surface of the polysilicon thin film by plasma dry-etching process;
  forming a semiconductor layer by patterning the polysilicon thin film;
  forming a gate insulating film covering the semiconductor layer;
  forming a gate electrode on the gate insulating film opposite the semiconductor layer;
  forming a source region and a drain region opposite each other with respect to the gate electrode by implanting impurity into the semiconductor layer; and
  forming a source electrode and a drain electrode electrically connected to the source region and the drain region, respectively.

10. The method of claim 9, wherein the mask has at least two areas having the slit patterns, and the slit patterns in each area have the same width.

11. The method of claim 10, wherein center lines of the plurality of slit patterns in the areas along the direction coincide.

12. The method of claim 11, wherein the widths of the slit patterns on the respective areas have multiple of the minimum width of the slit patterns.

* * * * *